United States Patent
Kudoh et al.

(10) Patent No.: US 9,859,596 B2
(45) Date of Patent: Jan. 2, 2018

(54) REPEATEDLY CHARGEABLE AND DISCHARGEABLE QUANTUM BATTERY

(75) Inventors: Takuo Kudoh, Tokyo (JP); Akira Nakazawa, Kobe (JP); Nobuaki Terakado, Kobe (JP)

(73) Assignees: KABUSHIKI KAISHA NIHON MICRONICS, Tokyo (JP); GUALA TECHNOLOGY CO., LTD., Kobe (JP)

(*) Notice: Subject to any disclaimer, the term of this patent is extended or adjusted under 35 U.S.C. 154(b) by 257 days.

(21) Appl. No.: 14/355,509

(22) PCT Filed: Oct. 30, 2011

(86) PCT No.: PCT/JP2011/075011
§ 371 (c)(1),
(2), (4) Date: Aug. 4, 2014

(87) PCT Pub. No.: WO2013/065093
PCT Pub. Date: May 10, 2013

(65) Prior Publication Data
US 2014/0352775 A1    Dec. 4, 2014

(51) Int. Cl.
*H01M 10/00* (2006.01)
*H01M 10/02* (2006.01)
(Continued)

(52) U.S. Cl.
CPC .. *H01M 14/005* (2013.01); *H01L 31/022425* (2013.01); *H01L 49/00* (2013.01);
(Continued)

(58) Field of Classification Search
CPC ........... H01L 31/022425; H01L 49/006; Y02E 10/50; H01G 9/2031; H01G 9/2036;
(Continued)

(56) References Cited

U.S. PATENT DOCUMENTS 4,888,062 A * 12/1989 Nakagawa et al. ............ 136/258
5,913,986 A *  6/1999 Matsuyama .................. 136/255
(Continued)

FOREIGN PATENT DOCUMENTS

JP    A-5-210122    8/1993
JP    A-11-73964    3/1999
(Continued)

OTHER PUBLICATIONS

English machine translation of JP 2001-167808A.*
(Continued)

*Primary Examiner* — Lindsey Bernier
(74) *Attorney, Agent, or Firm* — Oliff PLC

(57) ABSTRACT

The purpose of this invention is to provide a repeatedly chargeable and dischargeable quantum battery that is available for a long period of time without an aging change. The quantum battery is charged by causing an n-type metal oxide semiconductor to have a photo-exited structural change, thereby the electrode of quantum battery is prevented from being oxide and a price reduction and stable operation are possible. The repeatedly usable quantum battery is constituted by laminating; a first metal electrode having an oxidation preventing function, charging layer in which an energy level is formed in the band gap by causing an n-type metal oxide semiconductor covered with an insulating material to have a photo-exited structure change and electrons are trapped at the energy level; p-type metal oxide semiconductor layer; and a second metal electrode having the oxidation preventing function, the electrodes are passive metal layers formed of metals having passive characteristics.

13 Claims, 17 Drawing Sheets

(51) Int. Cl.
*H01M 14/00* (2006.01)
*H01L 31/0224* (2006.01)
*H01L 49/00* (2006.01)
*H02J 7/32* (2006.01)

(52) U.S. Cl.
CPC ........... *H01M 10/00* (2013.01); *H01M 10/02* (2013.01); *H01M 14/00* (2013.01); *H02J 7/324* (2013.01)

(58) Field of Classification Search
CPC ...... H01M 10/02; H01M 10/00; H01M 14/00; H01M 14/005
USPC .......................................... 136/252, 255, 256
See application file for complete search history.

(56) References Cited

U.S. PATENT DOCUMENTS

| | | | | |
|---|---|---|---|---|
| 8,981,207 | B1* | 3/2015 | Pethuraja et al. | 136/253 |
| 2007/0137693 | A1* | 6/2007 | Forrest | 136/255 |
| 2010/0067089 | A1 | 3/2010 | Nakazawa | |
| 2010/0288345 | A1 | 11/2010 | Huang | |
| 2013/0224596 | A1* | 8/2013 | Nakazawa | 429/220 |
| 2013/0276878 | A1* | 10/2013 | Nakazawa | 136/256 |

FOREIGN PATENT DOCUMENTS

| | | |
|---|---|---|
| JP | 2001-053329 A | 2/2001 |
| JP | 2001167808 A * | 6/2001 |
| JP | A-2002-124256 | 4/2002 |
| JP | A-2006-286314 | 10/2006 |
| JP | A-2007-27032 | 2/2007 |
| JP | 2009-065216 A | 3/2009 |
| JP | 2009-076714 A | 4/2009 |
| JP | A-2009-167486 | 7/2009 |
| JP | 2011-176225 A | 9/2011 |
| WO | WO 2008/053561 A1 | 5/2008 |

OTHER PUBLICATIONS

Palomares et al. "Control of charge recombination dynamics in dye sensitized solar cells by the use of conformally deposited metal oxide blocking layers". J. Am. Chem. Soc. 2003, 125, 475-482.*
Kajiyama, Hiroshi, "Guala Battery", retrieved on Oct. 28, 2011, URL: [online] Nov. 29, 2010 <http://133.41.4.55/upload/83/riezon/2010/hp/a-2kajiyama >.
International Search Report issued in International Application No. PCT/JP2011/075011 dated Feb. 7, 2012 (with translation).
Kajiyama, Hiroshi, "Guala Battery", retrieved on Oct. 28, 2011, URL: [online] Nov. 29, 2010 <<http://133.41.4.55/upload/83/riezon/2010/hp/a-2kajiyama>>.
Yamada and Kanemitsu, "Determination of Electron and Hole Lifetimes of Rutile and Anatase $TiO_2$ Single Crystals", Applied Physics Letters (2012), Sep. 27, 2012 [http://hdl.handle.net/2433/159643].

* cited by examiner

REPEATEDLY CHARGEABLE AND DISCHARGEABLE QUANTUM BATTERY

TECHNICAL FIELD

The present invention relates to an electrode for a quantum battery based on an operation principle in which a new energy level is formed in a band gap through the photo-excited structural change of a metal oxide caused by ultraviolet irradiation, and electrons are trapped in the energy level in the band gap, thereby charging a battery.

BACKGROUND ART

Secondary batteries have been widely distributed for mobile terminals such as mobile phones and notebook computers and electric vehicles, and are repeatedly used through charging and discharging. In secondary batteries of the related art, electrodes were deteriorated from the repetitive charging and discharging of large power and large capacitance, and furthermore, the characteristics of the batteries were also degraded from deterioration over time, deterioration caused by the oxidization of electrodes, and the like, thereby hindering the extension of the service life.

Particularly, regarding the oxidization of electrodes, there is an essential problem depending on the charging principles of individual secondary batteries.

In a lithium battery, a metal oxide containing lithium is used as the positive electrode, on the other hand, a material capable of storing and releasing lithium such as carbon is used as the negative electrode, and the materials are impregnated with an electrolytic solution made up of a lithium salt capable of dissociating ions and an organic solvent capable of dissolving the lithium salt. As an electrode for the above-described lithium battery, a carbon electrode made of graphite powder improved for high performance and an increase in capacitance has been disclosed (for example, refer to PTL 1, 2 or the like).

In addition, there is another proposal that, in a non-aqueous electrolytic solution secondary battery provided with a negative electrode containing silicone as a negative electrode active material, a positive electrode containing a positive electrode active material and a non-aqueous electrolytic solution, an additive suppressing the oxidization of silicone during the operation of the battery is contained in the negative electrode or on the surface of the negative electrode, and a film-forming agent for forming a film on the surface of the negative electrode in the non-aqueous electrolytic solution is contained (for example, refer to PTL 3 or the like).

In addition, in a polymer electrolyte fuel battery, a cell in which a solid polymer film is interposed between separator pieces is used as a unit cell and a number of cells are stacked, and, since the separator pinching the solid polymer film is required to have favorable conductivity and low contact resistance, a graphite separator has thus far been used. However, since the graphite separator is brittle, instead of graphite, stainless steel is used as the separator, the surfaces of a steel sheet are coated with passivation films formed of an oxide or hydroxide of Cr, Mo, Fe or the like that is a component of stainless steel, and the anti-corrosion effect for the basic steel is obtained from the barrier effect of the passivation film (for example, refer to PTL 4, 5 or the like).

As described above, a variety of countermeasures have been proposed regarding the oxidization of electrodes in individual secondary batteries from the viewpoint of the principles of battery functions and structural aspects.

CITATION LIST

Patent Literature

PTL 1: JP-A-2002-124256
PTL 2: JP-A-11-73964
PTL 3: JP-A-2006-286314
PTL 4: JP-A-2007-27032
PTL 5: JP-A-2009-167486

SUMMARY OF INVENTION

Technical Problem

The invention describes a quantum battery that is a secondary battery configured by laminating a first conductive electrode, a charging layer that forms an energy level in the band gap through a photo-excited structural change of an n-type metal oxide semiconductor coated with an insulating substance, thereby trapping electrons, a p-type semiconductor layer and a second conductive electrode (PCT/JP2010/067643).

The quantum battery is structured to have the laminated charging layer and the p-type semiconductor layer pinched from both sides using the electrodes, and a metallic material is used as the electrode material. In the above-described laminate structure, when the charging layer is formed on one electrode or when the other electrode is formed on the p-type semiconductor layer, there is a problem in that the metal electrode is oxidized due to heat generated in a thermal process during the manufacturing of the battery, the adhesion with the charging layer or the p-type metal oxide semiconductor layer is decreased, and, in a case in which the adhesion is significantly decreased, the electrode is peeled off.

An object of the invention is to solve the problem of the electrode that is peeled off in a thermal process during the manufacturing of the battery in a quantum battery being charged by forming an electron-trapping level in the band gap through a photo-excited structural change of an n-type metal oxide semiconductor and trapping electrons in the trapping level, and to provide a quantum battery that is available for a long period of time.

Solution to Problem

A quantum battery according to the invention is constituted of a first metal electrode; a charging layer that forms an energy level in a band gap through a photo-excited structural change of an n-type metal oxide semiconductor coated with an insulating substance so as to trap electrons; a p-type metal oxide semiconductor layer; and a second metal electrode, either the first metal electrode or the second metal electrode is a metal electrode having an oxidation preventing function.

Each of the first metal electrode and the second metal electrode may be a metal electrode having an oxidation preventing function.

The metal electrode having an oxidation preventing function is a passive metal layer having passivation characteristics. It is also possible to provide a plurality of passive metal layers.

In addition, either the first metal electrode or the second metal electrode may be a metal electrode configured by laminating a metal electrode made up of conductive metal layers and a metal electrode having an oxidation preventing function, and each of the first metal electrode and the second metal electrode may be a metal electrode configured by laminating a metal electrode made up of conductive metal layers and a metal electrode having an oxidation preventing function.

Even in this case, the metal electrode having an oxidation preventing function is a passive metal layer having passivation characteristics, and the passive metal layer may be a plurality of passive metal layers.

In the quantum battery, nickel oxide or copper aluminum oxide is an effective material for a p-type metal oxide semiconductor, but it is also possible to use a p-type semiconductor made of other materials.

In addition, the n-type metal oxide semiconductor in the charging layer is made of a material that is any one of stannic oxide, titanium dioxide and zinc oxide or a combination thereof, and is a complex having a charging function obtained through the photo-excited structural change caused by ultraviolet irradiation. The insulating substance coating the n-type metal oxide semiconductor is an insulating resin or an inorganic insulator.

A metallic material for the passive metal layer is at least any one of chromium, nickel, titanium and molybdenum. Furthermore, the metallic material for the passive metal layer may be an alloy containing at least any one of chromium, nickel, titanium and molybdenum. Furthermore, the metallic material for the passive metal layer may be an alloy containing at least copper and any one of chromium, nickel, titanium and molybdenum.

In the quantum battery, it is possible to use copper as the metallic material for the conductive metal layer and to use a flexible insulating sheet as a substrate.

Advantageous Effects of Invention

According to the quantum battery of the invention, it is possible to provide a stable quantum battery in which a problem of the peeling of an electrode due to the oxidation of a metal electrode in a thermal process during the manufacturing of the quantum battery is prevented, and the oxidation of the electrode due to changes over time is suppressed, thereby preventing deterioration or peeling, and enabling the repetition of charging and discharging over a long period of time.

DESCRIPTION OF EMBODIMENTS

The invention describes a quantum battery used as a secondary battery based on a new charging principle in which a photo-excitation structure-changing technique is employed for a charging layer, and a metal layer having passivation characteristics is provided to prevent deterioration caused by the oxidation of an electrode in a thermal process during the manufacturing of the battery or changes over time.

Figure 1:
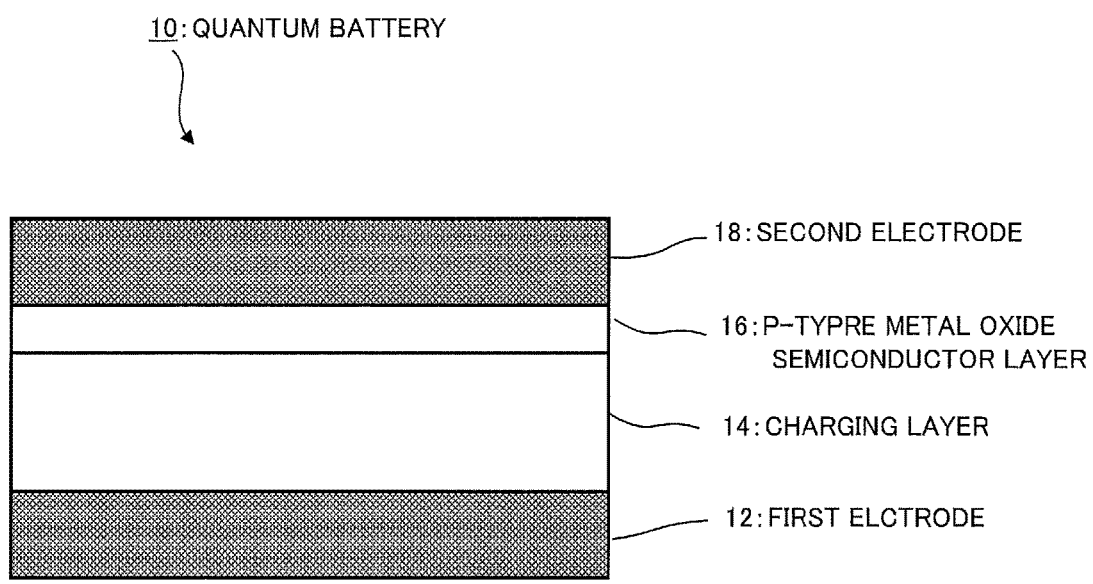
FIG. 1 is a view illustrating a configuration of a repeatedly chargeable and dischargeable quantum battery according to the invention.

FIG. 1 is a view illustrating a cross-sectional structure of a repeatedly chargeable and dischargeable quantum battery 10 according to the invention. In FIG. 1, the quantum battery 10 has a configuration in which a conductive first electrode 12 for which a metallic material having passivation characteristics is used, a charging layer 14 charging energy, a p-type metal oxide semiconductor layer 16, and a conductive second electrode 18 for which, similarly to the first electrode 12, a metallic material having passivation characteristics is used are laminated.

Functionally, the first electrode 12 and the second electrode 18 may be formed of a conductive film, and examples of a highly conductive metal that can be used include copper, a copper alloy, nickel, aluminum, silver, gold, zinc, tin and the like. Among the above-described metals, copper is cheap and suitable for a material for the electrode. In some embodiments, the first electrode 12 and the second electrode 18 are opaque to ultraviolet light.

However, generally, copper forms a copper I oxide film when left to stand in the atmospheric environment, and forms basic copper carbonate in a high humidity. Furthermore, there is a case in which copper is oxidized due to sulfur oxide in the air so as to form copper sulfide or copper sulfate. Therefore, in a case in which the function of copper as an electrode deteriorates significantly, copper peels off. While there might be a difference in the degree of oxidation, other metallic materials also have a problem of oxidation, and the oxidation significantly shortens the service life. Particularly, in the present quantum battery 10, there is a problem in that the first electrode 12 may be oxidized while forming the charging layer 14.

As means for solving the above-described problem, it is effective to add an anti-oxidization function to the metal electrode, and therefore, in a case in which the electrode is constituted of a metallic material, a material having passivation characteristics is applied, thereby preventing the oxidation in a thermal process during the manufacturing of the battery and extending the service life of the battery, which is the core of the invention.

Passivity refers to a state in which metal corrodes at an extremely low speed although the metal belongs to a base (active) electromotive series, and is a property considered as the basis of the corrosion resistance of a metallic material. A metal that is significantly polarized due to a slight anode current is passivated when behaving similarly to a very electrochemically-noble (inactive) metal. In this case, an oxide film that is a corrosion product becomes protective, and provides corrosion resistance.

The corrosion area can be investigated using an anode polarization curve in which a potential is applied to an electrode in the positive direction so as to cause an oxidation reaction. In a case in which the potential is low, the current increases along with the potential. When the potential exceeds a certain value, the current decreases abruptly, remains constant across a certain potential range, and then increases again. The potential range in which the current increases for the first time is called an active range, the potential range in which the current is held at a low value is called a passivity range, and the potential range in which the current increases again is called a transpassivity range. In the passivity range, the protective performance is high, and a several nanometer-thick passive oxide film is formed.

As is evident from an anode curve, in the passivity range, the current decreases, that is, the conductivity is impaired, but it is common to protect an electrode from the contact with the atmosphere, and the electrode is oxidized only locally. Therefore, a quantum battery becomes possible which prevents the deterioration of an electrode by suppressing oxidation to a local extent, and can be used for a long period of time in spite of repetitive charging and discharging.

Specific examples of a metallic material having passivation characteristics include chromium, nickel, titanium, molybdenum and the like, and the metallic material may be an alloy containing at least one of chromium, nickel, titanium and molybdenum.

Figure 2:
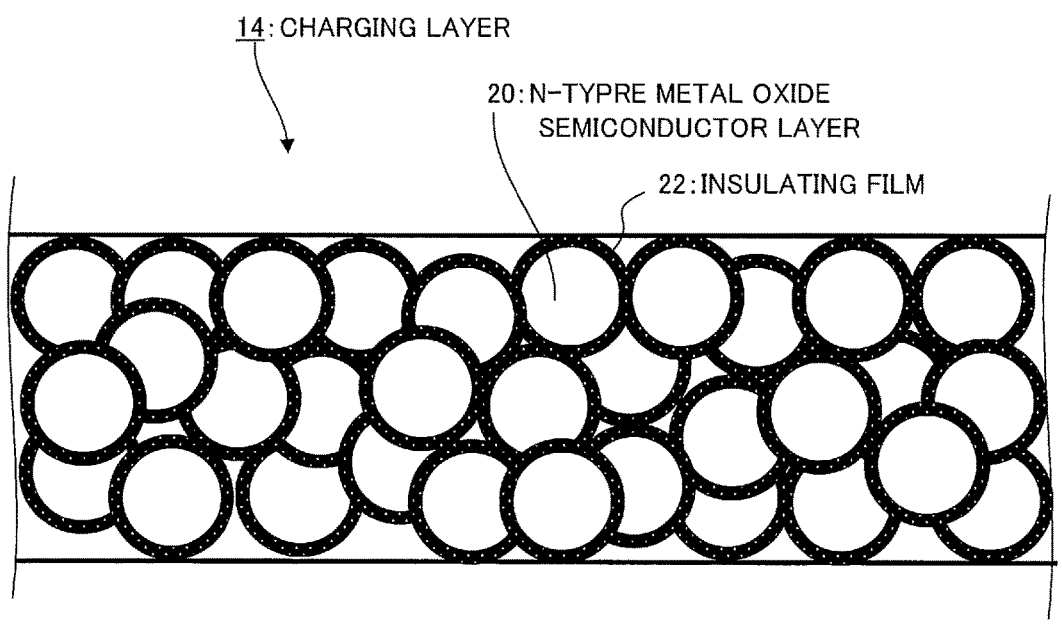
FIG. 2 is a view describing a charging layer in the quantum battery according to the invention.

FIG. 2 is a view describing the charging layer in the quantum battery to which the invention is applied. In FIG. 2, the charging layer 14 is provided with a structure in which silicone is used as an insulating film 22, titanium dioxide is used as an n-type metal oxide semiconductor 20, atomized titanium dioxide is coated with silicone, and loaded into the charging layer 14. When irradiated with ultraviolet rays so as to cause a photo-excited structural change, titanium dioxide obtains a function of storing energy.

Examples of a material for the n-type metal oxide semiconductor 20 used in the charging layer 14 include titanium dioxide, stannic oxide and zinc oxide, and the material is manufactured by decomposing an aliphatic acid salt of a metal. Therefore, an aliphatic acid that can turn into a metal oxide through combustion in an oxidizing atmosphere is used as the aliphatic acid salt of a metal. When a material having passivation characteristics is used as the metal electrode, it is possible to prevent oxidation caused by combustion.

For the insulating film 22, mineral oil, magnesium oxide (MgO) or silicon dioxide ($SiO_2$) may be used as an inorganic insulating material in addition to silicone, and an insulating resin may be a thermoplastic resin such as polyethylene or polypropylene or a thermosetting resin such as a phenol resin or an amino resin.

In the charging layer 14, a substance irradiated with ultraviolet rays forms a new energy level through a photo-excited structural change. The photo-excited structural change refers to a phenomenon of a change of the lattice distance in a substance excited by the irradiation of light, and the n-type metal oxide semiconductor 20 that is an amorphous metal oxide has a property of causing a photo-excited structural change. A state of a new energy level formed by the photo-excited structural change in the charging layer 14 in a case in which titanium dioxide is used as the n-type metal oxide semiconductor 20 and silicone is used as a material for the insulating film will be described below using a band view.

Figure 3:
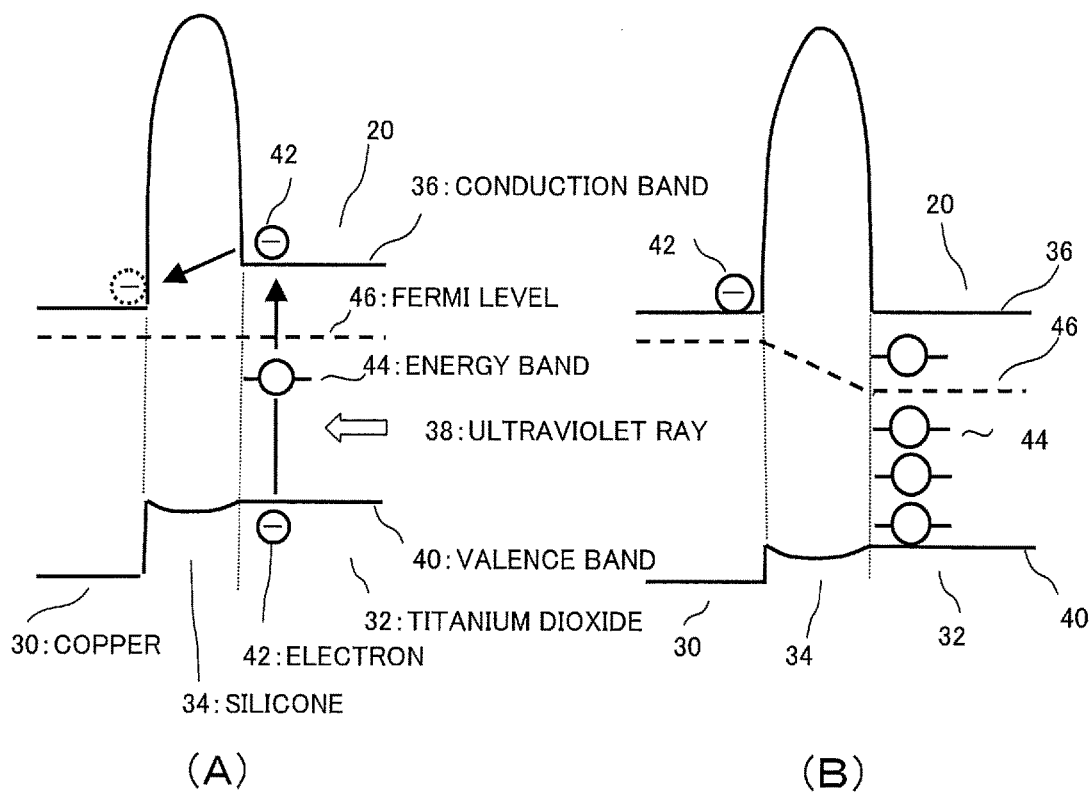
FIG. 3 is a band view describing a new energy level formed due to a photo-excited structural change.

FIGS. 3(A) and 3(B) are band views describing a state of a new energy level 44 formed due to the photo-excited structural change in a case in which silicone 34 is present as the insulating film 22 between a metal of copper 30 as the first electrode 12 and titanium dioxide 32 as the n-type metal oxide semiconductor 20. As a result of the photo-excited structural change phenomenon, the new energy level 44 is formed in a band gap of the n-type metal oxide semiconductor 20. In a conduction band 36, a barrier is present due to an insulating layer formed of the silicone 34.

FIG. 3(A) illustrates a state in which an ultraviolet ray 38 is irradiated in a case in which the insulating layer formed of the silicone 34 is present between the titanium dioxide 32 and the copper 30. When the ultraviolet ray 38 is irradiated on the titanium dioxide 32 coated with the insulating layer, an electron 42 present in a valence band 40 of the titanium dioxide 32 is excited to the conduction band 36. In the vicinity of an interface with the copper 30, the electron 42 passes through the insulating layer of the silicone 34 at a certain probability, and temporarily moves into the copper 30. The photo-excited structural change of titanium dioxide 32 occurs while the electron 42 is absent, and the interatomic distance changes at a portion at which the electron 42 in the valence band 40 is removed. At this time, the energy level 44 moves into a band gap within the Fermi level 46.

FIG. 3(B) illustrates a state in which the above-described phenomenon has repeatedly occurred while the ultraviolet ray 38 is irradiated, and a number of energy levels 44 are formed in the band gap. However, the electron 42 that is supposed to be trapped in the energy level 44 is excited by the ultraviolet ray 38 and moves into the copper 30. The energy level 44 in an electron-absent band gap generated as described above remains even after the ultraviolet irradiation ends.

The role of the silicone 34 as the insulating layer is to produce a barrier between the copper 30 and the titanium dioxide 32 so as to allow the energy level 44 to be formed in the electron-absent band gap after the excited electron 42 passes through the barrier using a tunnel effect. The electron 42 moved into the copper 30 remains in the copper 30 due to a charged potential in the vicinity of the silicone 34.

Figure 4:
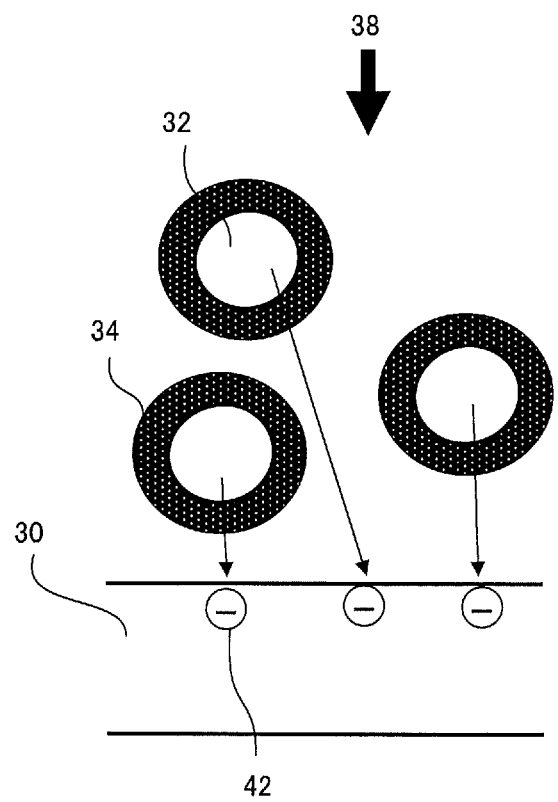
FIG. 4 is a view describing the behavior of electrons caused by a photo-excited structural change.

FIG. 4 is a view schematically expressing a state of the electrons 42 moved into the copper 30 due to the photo-excited structural change of the titanium dioxide 32 coated with the silicone 34 caused by the irradiation of ultraviolet rays. The electrons 42 pass through the barrier formed of the silicone 34 using the tunnel effect, move into the copper 30, and remain in the copper due to a weak trapping force generated by the potential of the silicone 34.

Figure 5:
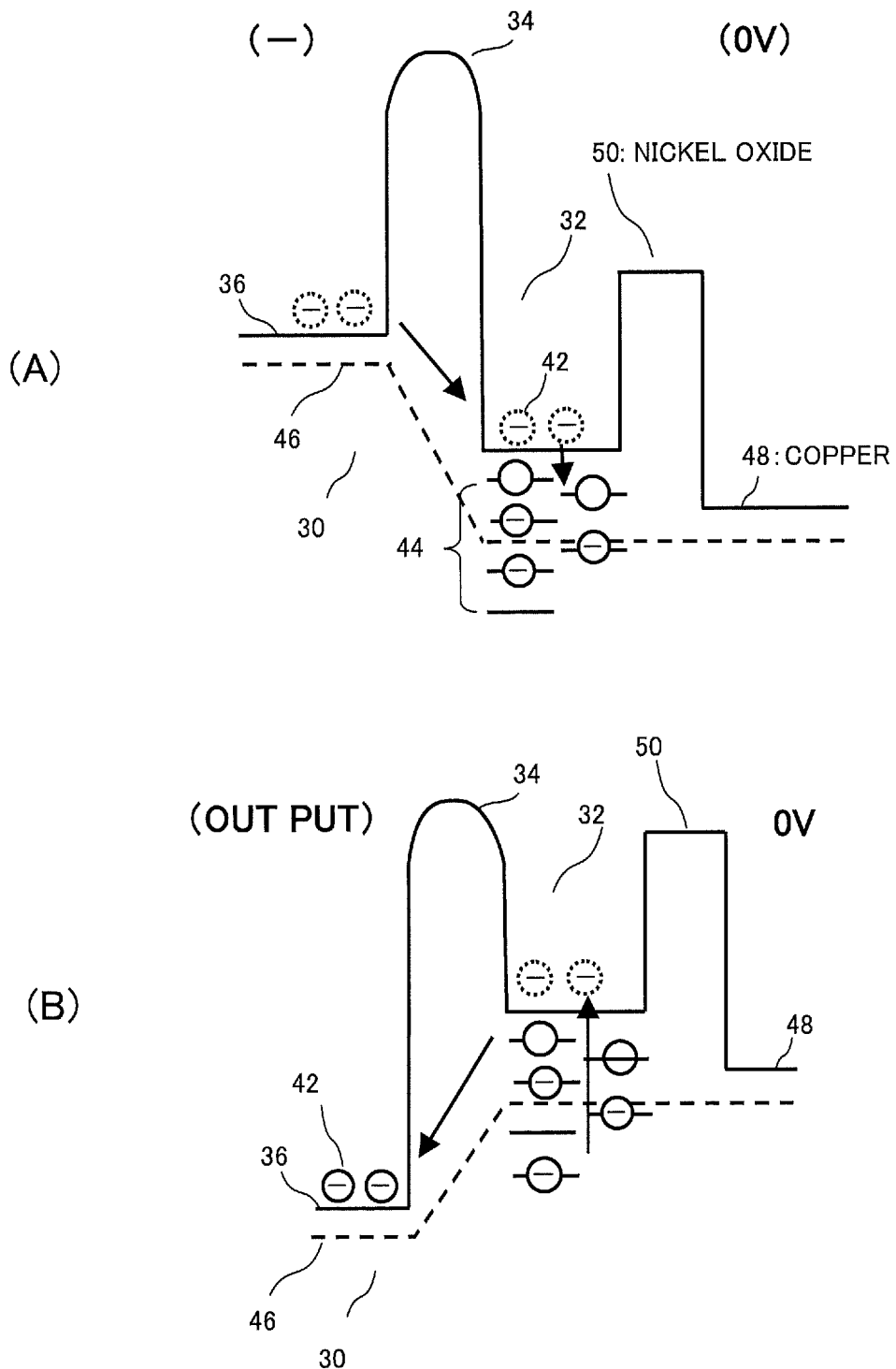
FIG. 5 is a band view describing a charging and discharging function of a secondary battery to which the invention is applied.

As a secondary battery, the p-type metal oxide semiconductor layer 16 is laminated on the charging layer 14 so as to form a blocking layer, and the second electrode 18 is provided on the blocking layer. A principle of the secondary battery having the above-described structure will be described using the band view in FIG. 5.

FIG. 5(A) is a band view in a case in which, in the quantum battery 10 constituted of nickel oxide 50 that is interposed between the copper 30 configuring the first electrode 12 and copper 48 configuring the second electrode 18 and functions as the silicone 34 and the titanium dioxide 32 in the charging layer 14 and the p-type metal oxide semiconductor layer 16, a negative voltage is applied to the copper 48 configuring the second electrode 18, and the copper 30 configuring the first electrode 12 is grounded so as to be set to 0 V.

When a bias electric field (−) is applied to the titanium dioxide 32 having the energy level 44 in the band gap, the electrons 42 in the copper 30 pass through (tunneling) the barrier formed of the silicone 34, and move into the titanium dioxide 32. The moved electrons 42 are blocked by the nickel oxide 50 from further moving into the copper 48, and thus are trapped in the energy level 44 present in the band gap of the titanium dioxide 32, whereby energy is stored. That is, a charged state in which the charging layer 14 is filled with the electrons 42 is obtained. This state is maintained even after the application of the bias electric field is stopped, and thus the quantum battery functions as a secondary battery.

FIG. 5(B) is a band view of a case in which a load (not illustrated) is connected to the copper 30 and the copper 48 and the quantum battery is discharged. The electrons 42 trapped in the band gap turn into free electrons in the conduction band 36. The free electrons move into the copper 30 and then flow into the load. The above-described phenomenon is the output state of energy, that is, a discharging state. In addition, in the end, all electrons 42 move away from the energy level 44 in the band gap, and the entire energy is consumed.

As described above, when voltage is applied from outside to the energy level formed in the band gap of the titanium dioxide so as to form an electric field and load electrons, and a load is connected to the electrodes, energy is extracted by releasing the electrons, and the quantum battery functions as a battery. The quantum battery can be used as a secondary battery by repeating the above-described phenomenon.

What has been described above is the principle of a basic quantum battery to which the invention is applied.

Thus far, a principle of a basic secondary battery has been described, and, in principle, since the electrons 42 move into the first electrode 12 through the insulating film 22 using the tunnel effect, and remain in the first electrode, the adhesion between the charging layer 14 and the first electrode 12 becomes extremely important. Therefore, it becomes necessary to prevent the degradation of the adhesion caused by the oxidization of the electrodes caused by the thermal process during the manufacturing of the battery and changes over time.

For the above-described reason, deterioration from the oxidation of the electrode has a large influence on the quantum battery to which the invention is applied, and, when a metal having passivation characteristics is used to form the electrode so as to suppress the deterioration of the electrode to partial surface oxidation, it is possible to prevent the oxidation caused by the thermal process during the manufacturing of the battery or changes over time and to extend the service life of the quantum battery.

Since the second electrode 18 is laminated on the p-type metal oxide semiconductor layer 16, there is no serious problem with the adhesion with the first electrode 12, but the influence of the deterioration of the electrode is still a critical problem to the second electrode 18 as well.

Therefore, to the second electrode 18 as well, an electrode constituted using a metallic material having passivation characteristics becomes effective means for the adhesion during the manufacturing and the extension of the service life of the quantum battery 10 to which the invention is applied.

Figure 6:
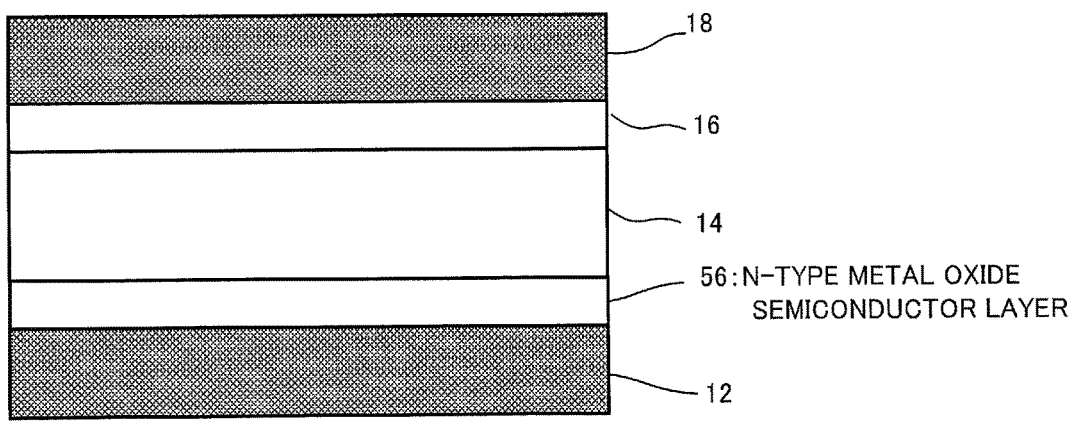
FIG. 6 is an explanatory view of the quantum battery into which an n-type metal oxide semiconductor layer is inserted.

FIG. 6 illustrates a case in which the invention is applied to a quantum battery 54 having an n-type metal oxide semiconductor layer 56 interposed between the first electrode 12 and the charging layer 14.

While the titanium dioxide 32 in the charging layer 14 is surrounded by the insulating film formed of the silicone 34, the film is not always uniform, and there is a case in which the titanium dioxide 32 comes into direct contact with the electrode through portions on which the film is not formed. In such a case, the electrons 42 are injected into the titanium dioxide 32 through recombination, the energy level 44 is not formed in the band gap, and the charging capacitance decreases. Therefore, to suppress the decrease in the charging capacitance and to produce a higher-performance secondary battery, a titanium dioxide thin layer is formed between the first electrode 12 and the charging layer 14 as an n-type metal oxide semiconductor layer 56 as illustrated in FIG. 6. The titanium dioxide thin layer functions as an insulating layer, contributes to performance improvement, furthermore, rarely causes characteristic variations of an element, and has an effective structure for the stability in the manufacturing line and the improvement of yield.

It is also possible to apply the invention to the quantum battery 54 having the n-type metal oxide semiconductor layer 56 formed between the first electrode 12 and the charging layer 14, and then an effect that suppresses the deterioration of the electrode even after repetitive charging and discharging is exhibited.

Thus far, a case in which the invention in which the electrodes having passivation characteristics are used is applied to the first electrode and the second electrode has been described, but the invention exhibits the same effect even when applied to only one electrode.

Figure 7:
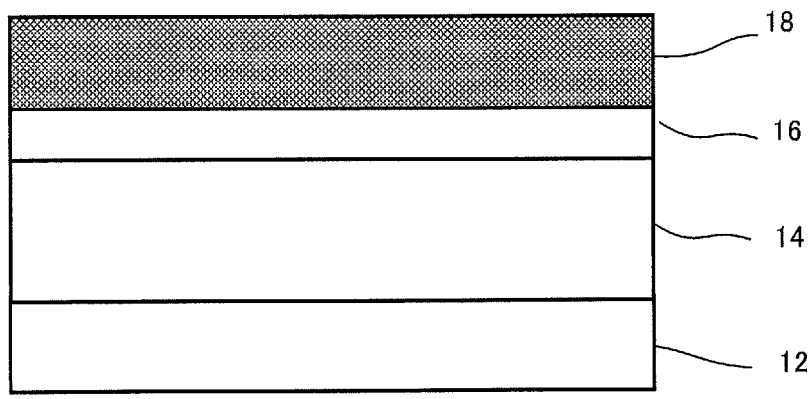
FIG. 7 is an explanatory view of the quantum battery in which a metallic material having passivation characteristics is used only for a second electrode.
Figure 8:
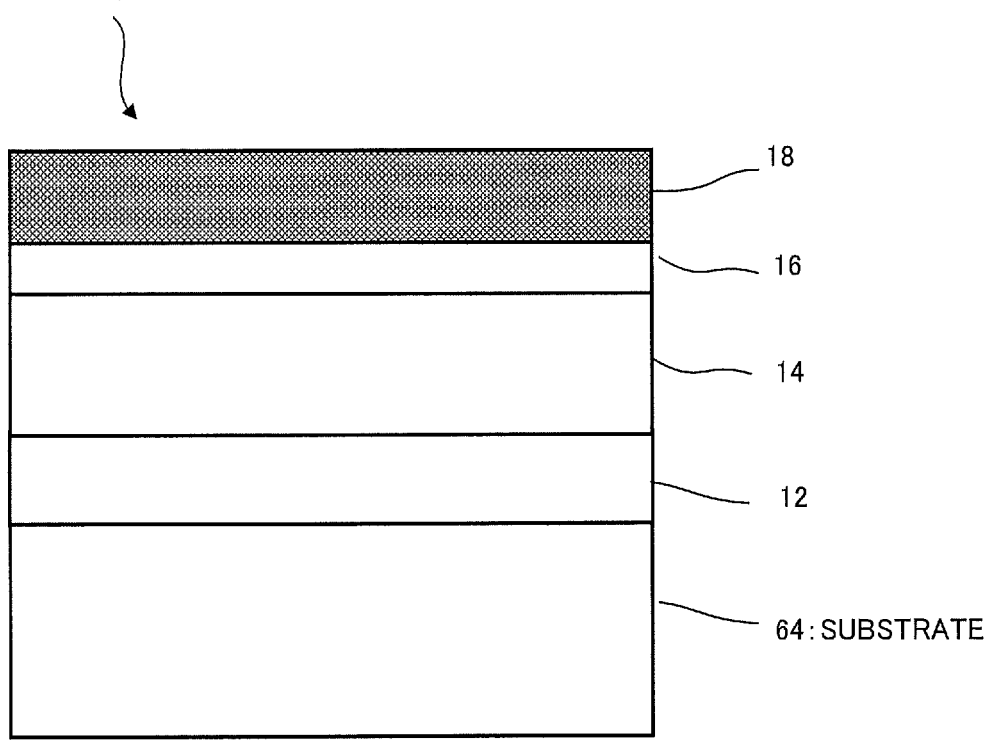
FIG. 8 is an explanatory view of the quantum battery in which a metallic material having passivation characteristics is used only for the second electrode, and a substrate is provided on a first electrode side.

FIG. 7 illustrates an example of a quantum battery 60 in which a metallic material having passivation characteristics is used only for the second electrode 18. In this case, it is possible to provide a structure in which the oxidation of the electrode is suppressed by providing a substrate 64 on the first electrode 12 for which a metallic material having no passivation characteristics is used as in a quantum battery 62 illustrated in FIG. 8.

Figure 9:
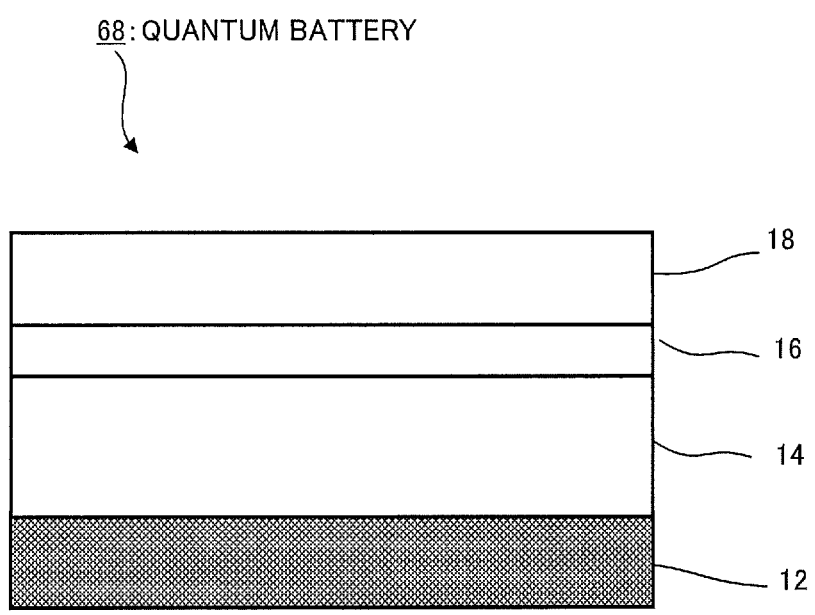
FIG. 9 is an explanatory view of the quantum battery in which a metallic material having passivation characteristics is used only for a first electrode.
Figure 10:
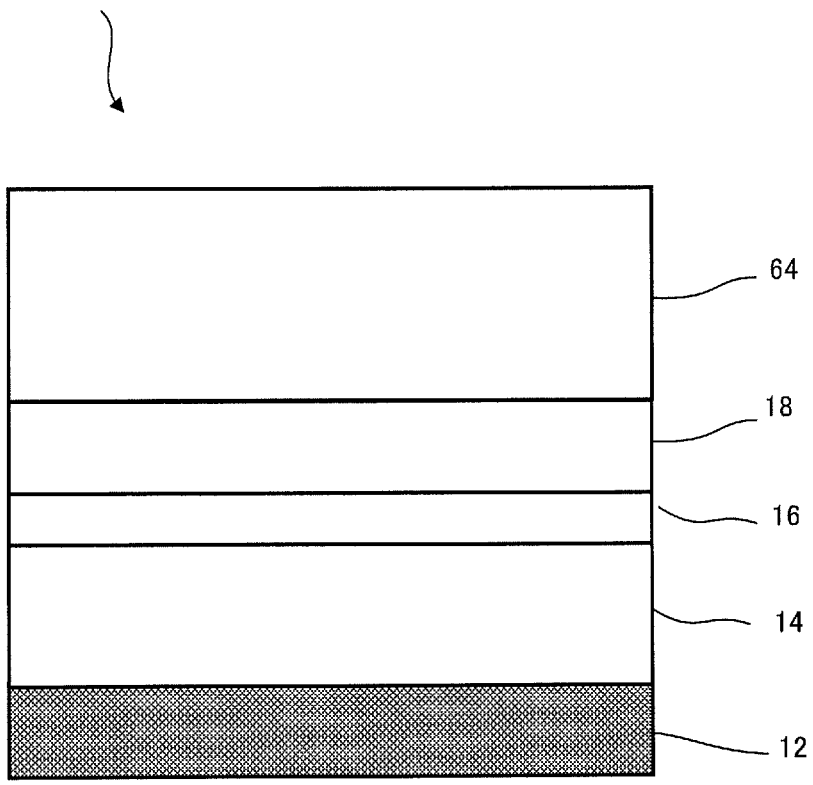
FIG. 10 is an explanatory view of the quantum battery in which a metallic material having passivation characteristics is used only for the first electrode, and the substrate is provided on a second electrode side.

FIG. 9 illustrates a quantum battery 68 in which a metallic material having passivation characteristics is used as the first electrode 12, and FIG. 10 illustrates an example of a quantum battery 70 in which the substrate 64 is provided on the second electrode 18.

In this example, a case in which a metallic material having passivation characteristics is used as the first electrode 12 and the second electrode 18 has been described, but it is possible to make the first electrode 12 and the second electrode 18 in a laminated structure of a conductive metal layer having conductivity and a passive metal layer having passivation characteristics.

Figure 11:
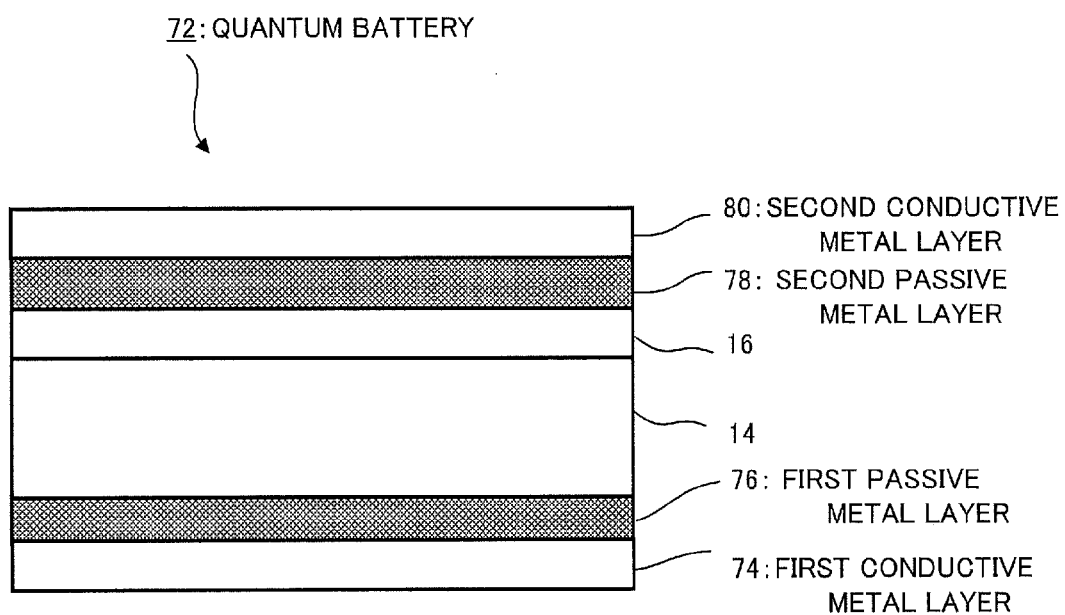
FIG. 11 is an explanatory view of the quantum battery in which the first electrode and the second electrode are provided with a laminate structure of a conductive metal layer with conductivity and a passive metal layer having passivation characteristics.

FIG. 11 illustrates a quantum battery 72 in which the first electrode 12 and the second electrode 18 have a laminated structure. In FIG. 11, the first electrode 12 has a laminated structure of a first conductive metal layer 74 and a first passive metal layer 76. The first passive metal layer 76 is provided on the charging layer 14. Similarly, the second electrode 18 also has a laminated structure of a second conductive metal layer 80 and a second passive metal layer 78, and the second passive metal layer 78 is provided on the p-type metal oxide semiconductor layer 16.

For the first passive metal layer 76 and the second passive metal layer 78, the same metallic material as the material used as the electrodes as the metallic material having passivation characteristics can be used. That is, the metallic material is chromium, nickel, titanium, molybdenum or the like, and may be an alloy containing at least one of chromium, nickel, titanium, molybdenum and the like.

Figure 12:
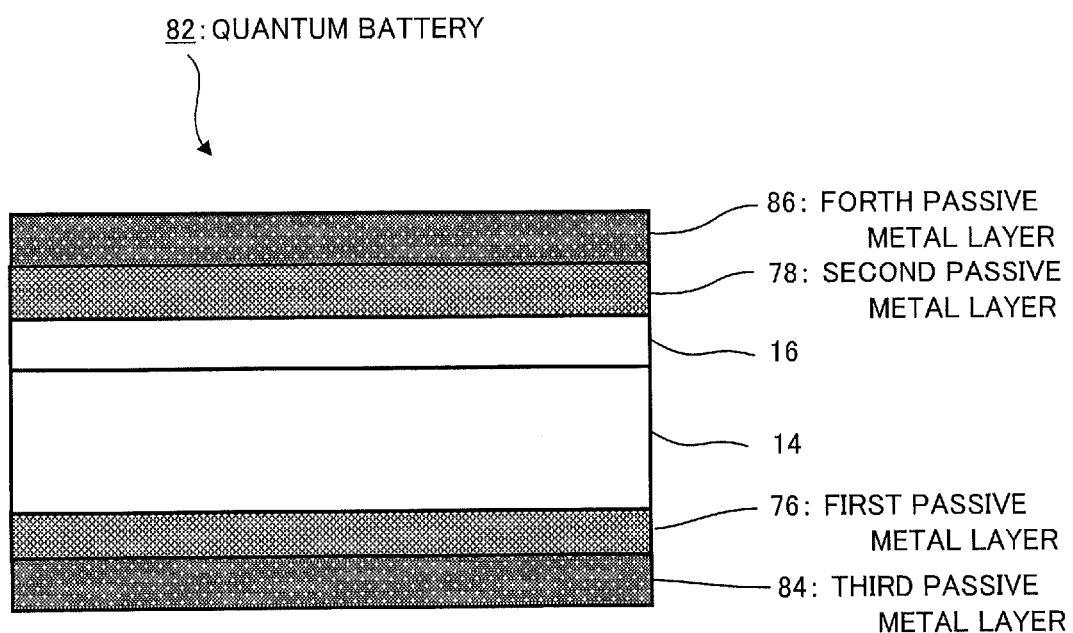
FIG. 12 is an explanatory view of the quantum battery in which the first electrode and the second electrode are provided with a laminate structure of the passive metal layer having passivation characteristics.

FIG. 12 illustrates a quantum battery 82 in which the first electrode 12 and the second electrode 18 have a laminated structure, the first conductive metal layer 74 and the second conductive metal layer 80 illustrated in FIG. 11 are made of a metallic material having passivation characteristics so as to form a third passive metal layer 84 and a fourth passive metal layer 86. Since the electrodes have a laminated structure of a metallic material having passivation characteristics, it is possible to further improve the effect to prevent the oxidation of the electrodes.

In this case, the metallic material having passivation characteristics is chromium, nickel, titanium, molybdenum or the like, and any alloy containing at least one of chromium, nickel, titanium, molybdenum and the like is used. Here, the first passive metal layer 76, the second passive metal layer 78, the third passive metal layer 84 and the fourth passive metal layer 86 do not need to be made of the same metallic material, and can be made of a variety of combinations of the metallic materials having passivation characteristics, and also may be made of a plurality of the passive metal layers.

In addition, a variety of combinations are possible in which one electrode has a laminated structure of metallic materials having passivation characteristics and the other electrode has a single layer, or only one electrode has a laminated structure of metallic materials having passivation characteristics, and one example will be described below.

Figure 13:
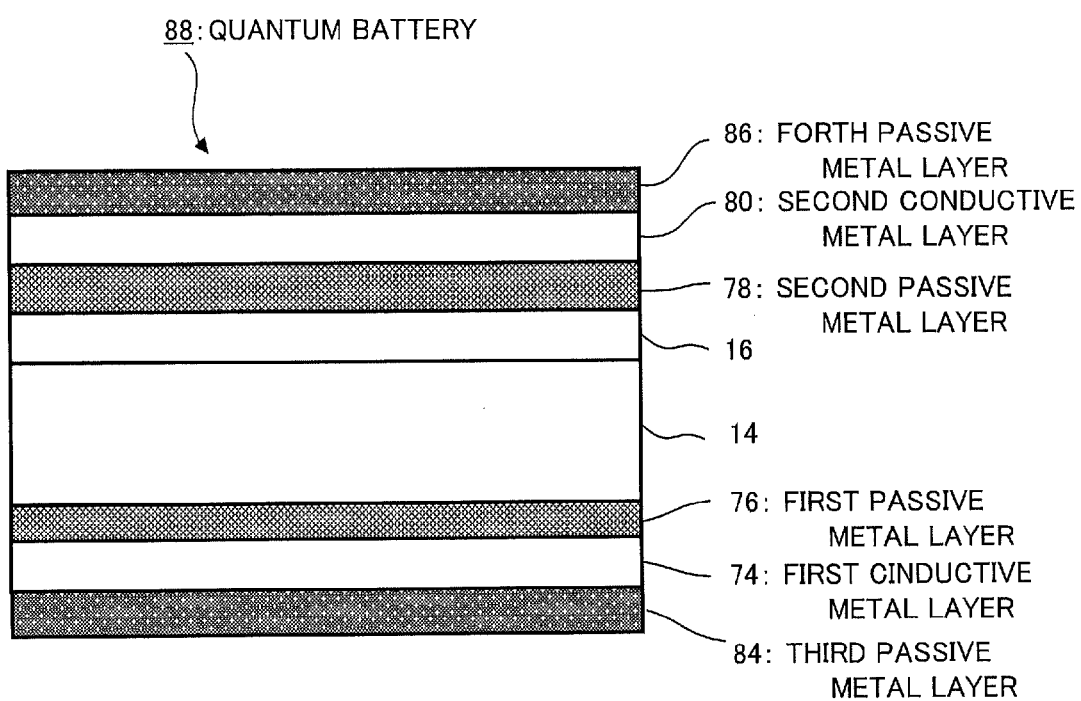
FIG. 13 is an explanatory view of the quantum battery in which the first electrode and the second electrode are provided with a laminate structure having the conductive metal layer with conductivity interposed between the passive metal layers having passivation characteristics.

FIG. 13 illustrates an example of a quantum battery 88 having a structure obtained by laminating a third passive metal layer 84 and a fourth passive metal layer 86 respectively on the first conductive metal layer 74 and the second conductive metal layer 80 of the quantum battery 82 in FIG. 12.

Figure 14:
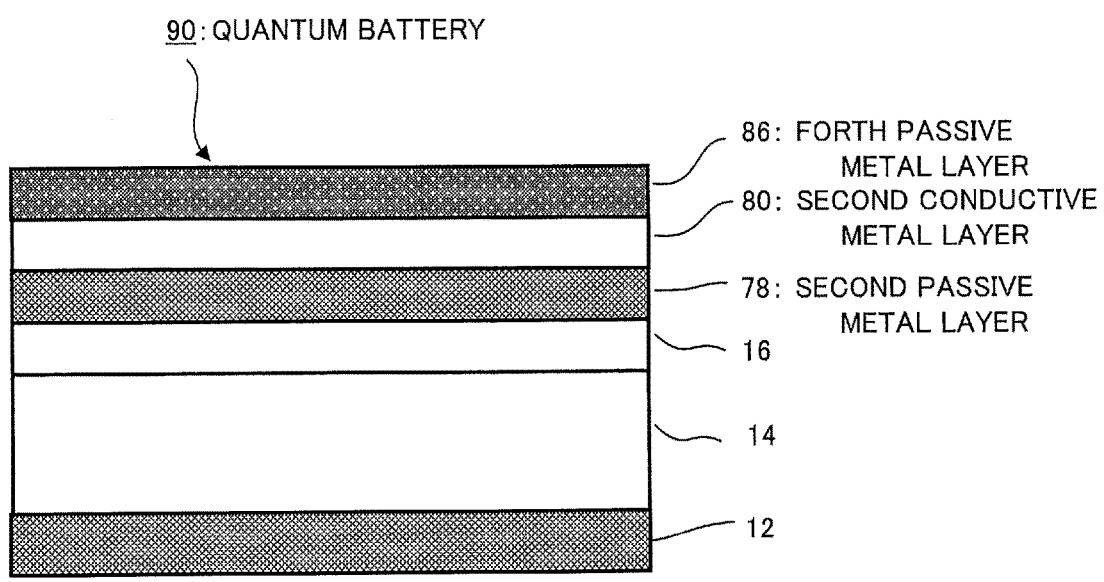
FIG. 14 is an explanatory view of the quantum battery in which the first electrode is a metal layer having passivation characteristics, and the second electrode is provided with a laminate structure having the conductive metal layer with conductivity interposed between the passive metal layers having passivation characteristics.

FIG. 14 illustrates an example of a quantum battery 90 in which the first electrode 12 is constituted of a metallic material having passivation and the second electrode 18 is a laminate of the second passive metal layer 78, the second conductive metal layer 80 and the fourth passive metal layer 86.

Figure 15:
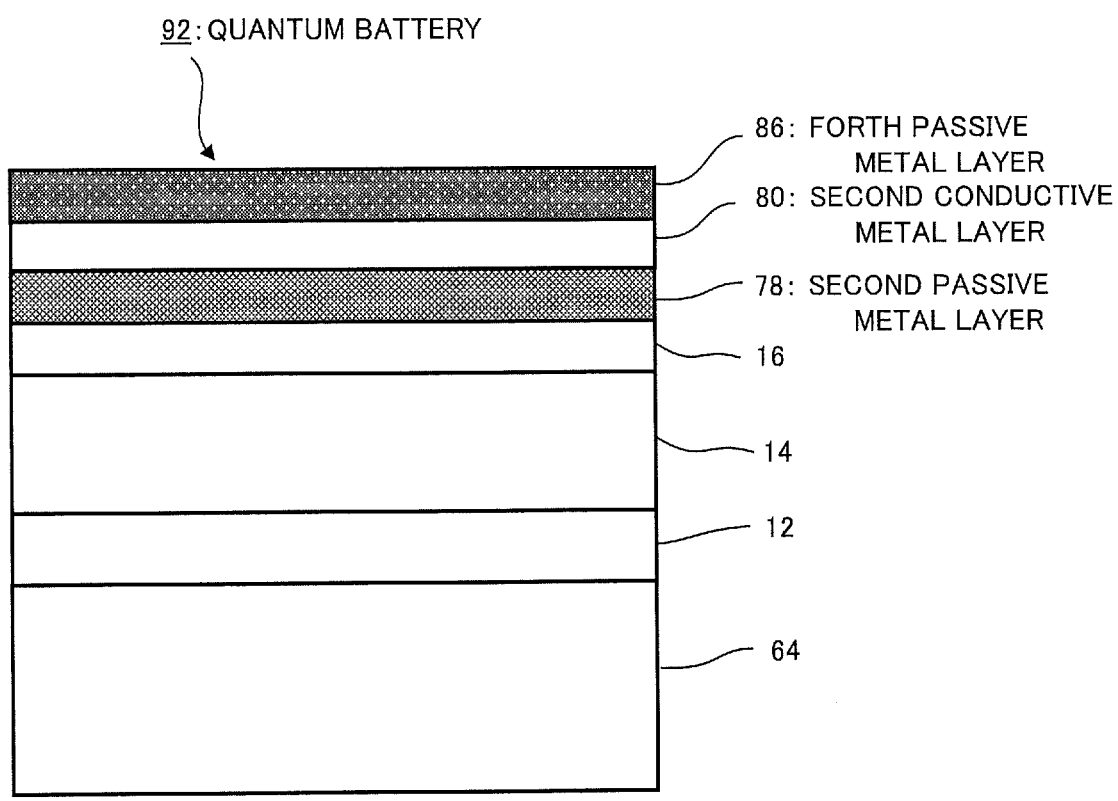
FIG. 15 is an explanatory view of the quantum battery in which the substrate is provided on the first electrode side, and the second electrode is provided with a laminate structure having the conductive metal layer with conductivity interposed between the passive metal layers having passivation characteristics.

FIG. 15 illustrates an example of a quantum battery 92 in which only the second electrode 18 has a laminated structure of the second passive metal layer 78, the second conductive metal layer 80 and the fourth passive metal layer 86, and the substrate 64 is provided on the first electrode 12.

Next, an example of an actually-prototyped quantum battery will be described.

Example 1

Figure 16:
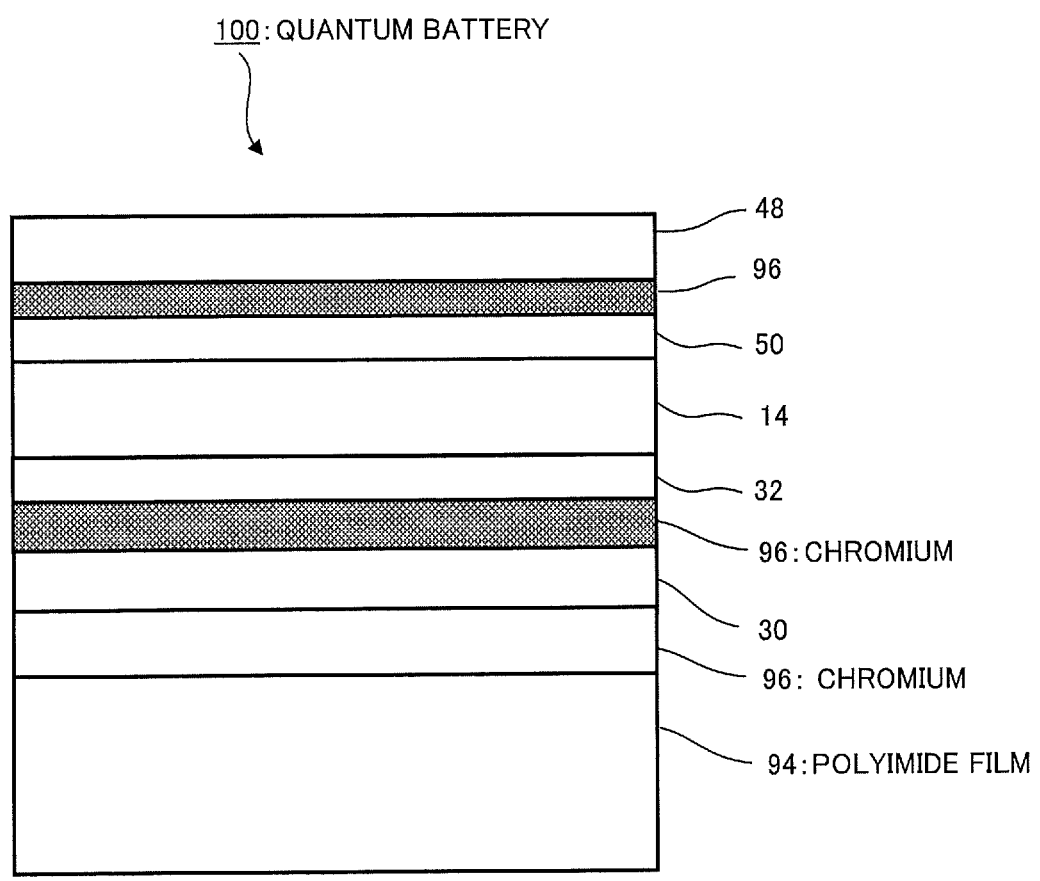
FIG. 16 is an example of the quantum battery carried out using a metal layer having passivation characteristics.

FIG. 16 illustrates an example of a quantum battery 100 prototyped on a glass substrate according to the invention using a polyimide film 94 as the substrate 64.

The polyimide film 94 is 4 μm-thick, and a 50 nm-thick chromium film 96 having passivation characteristics and a 300 nm-thick copper layer 30 are laminated on the polyimide film. Furthermore, a 50 nm-thick chromium layer 96 is laminated. When manufacturing the above-described charging layer 14, approximately 300° C. heat is generated in the manufacturing process.

At this phase, an ultraviolet ray 38 is irradiated on the charging layer 14 so as to cause a photo-excited structural change of titanium dioxide 32 and form a new energy level 44.

After that, a 150 nm-thick nickel oxide film 50 is formed, and a 50 nm-thick chromium film 96 and a 300 nm-thick copper film 48 are laminated, thereby completing a quantum battery 100.

When manufacturing the quantum battery 100, it is possible to use a gas-phase film-forming method such as sputtering, ion plating, electronic beam deposition, vacuum deposition or chemical deposition as a method for forming the respective layers. In addition, a metal electrode can be formed using an electrolytic plating method, a non-electrolytic plating method or the like.

Example 2

Figure 17:
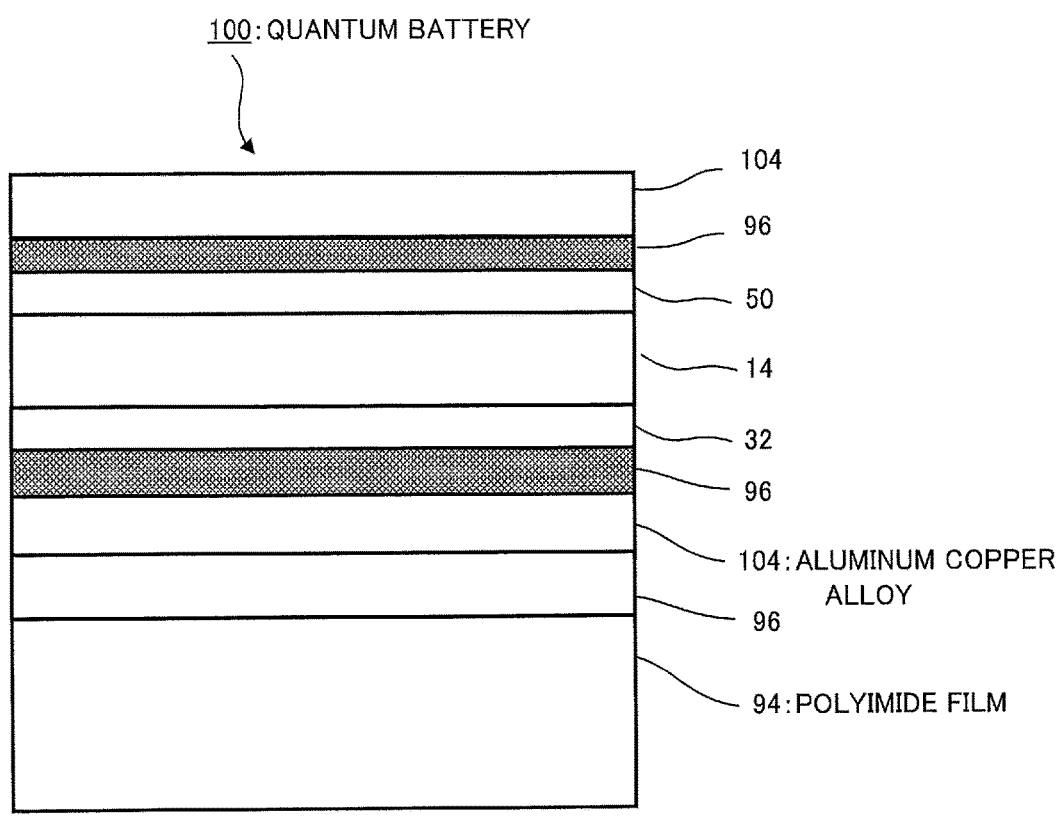
FIG. 17 is an example of the quantum battery carried out using an alloy layer of a metal having passivation characteristics.

FIG. 17 is an example of a quantum battery 102 prototyped using an alloy as a metallic material.

The polyimide film 94 is 4 μm-thick, and a 50 nm-thick chromium film 96 having passivation characteristics and, similarly, a 300 nm-thick aluminum copper alloy film 104 having passivation characteristics are laminated on the polyimide film. Furthermore, a 50 nm-thick chromium film 96 is laminated, and a 50 nm-thick titanium dioxide film 32 is laminated on the chromium film as the n-type metal oxide semiconductor layer. Next, a 1000 nm or more-thick film of titanium dioxide 32 miniaturized and coated with silicone 34 is laminated so as to produce a charging layer 14. In this case as well, similarly to Example 1, approximately 300° C. heat is generated in the manufacturing process when manufacturing the above-described charging layer 14.

Furthermore, similarly to Example 1, an ultraviolet ray is irradiated on the charging layer 14 so as to cause a photo-excited structural change of titanium dioxide, thereby forming a new energy level.

After that, a 150 nm-thick nickel oxide film 50 and a 50 nm-thick chromium film 96 are laminated, and a 300 nm-thick aluminum copper alloy film 104 is laminated, thereby completing a quantum battery 102.

Both in Examples 1 and 2, there were no electrodes oxidized in the thermal process during the manufacturing of the batteries, quantum batteries maintaining favorable charging and discharging repetition characteristics over a long period of time were obtained, and the effect to prevent the oxidation of the electrode could be confirmed.

Thus far, the embodiment of the invention has been described, and the invention can be modified as appropriate as long as the object and advantages of the invention are not impaired, and furthermore, the invention is not limited to the embodiment.

REFERENCE SIGNS LIST 10, 54, 60, 62, 68, 70, 72, 82, 88, 90, 92, 100, 102 quantum battery
12 first electrode
14 charging layer
16 p-type metal oxide semiconductor layer
18 second electrode
20 n-type metal oxide semiconductor
22 insulating film
30, 48 copper
32 titanium dioxide
34 silicone
36 conduction band
38 ultraviolet ray
40 valence band
42 electron
44 energy level
46 fermi level
50 nickel oxide
64 substrate
74 first conductive metal layer
76 first passive metal layer
78 second passive metal layer
80 second conductive metal layer
84 third passive metal layer
86 fourth passive metal layer
94 polyimide film
96 chromium
104 aluminum copper alloy

The invention claimed is:

1. A secondary battery comprising:
a first metal electrode;
a charging layer that forms an energy level in a band gap through a photo-excited structural change of an amorphous n-type metal oxide semiconductor coated with an insulating substance by irradiating with ultraviolet rays, thereby trapping electrons by applying voltage so as to charge, and the trapping electrons are held without an applied electric field;
a p-type metal oxide semiconductor layer; and
a second metal electrode,
wherein each of the first metal electrode and the second metal electrode is a metal electrode having an oxidation preventing function and passivation characteristics, and is configured to prevent peeling off in a manufacturing process including a thermal and irradiating process while forming the charging layer.

2. The secondary battery according to claim 1,
wherein the first metal electrode and the second metal electrode each include a plurality of passive metal layers having passivation characteristics.

3. The secondary battery according to claim 1,
wherein each of the first metal electrode and the second metal electrode is a metal electrode configured by laminating a metal electrode made up of conductive metal layers and a metal electrode having an oxidation preventing function.

4. The secondary battery according to claim 1,
wherein each of the first metal electrode and the second metal electrode includes a plurality of passive metal layers.

5. The secondary battery according to claim 1,
wherein the charging layer is provided with an additional n-type metal oxide semiconductor layer on an opposite side to a side on which the charging layer is in contact with the p-type metal oxide semiconductor layer.

6. The secondary battery according to claim 5,
wherein the additional n-type metal oxide semiconductor layer is titanium dioxide.

7. The secondary battery according to claim 1,
wherein the p-type metal oxide semiconductor layer is nickel oxide or copper aluminum oxide.

8. The secondary battery according to claim 1,
wherein the insulating substance coating the n-type metal oxide semiconductor is an insulating resin or an inorganic insulator.

9. The secondary battery according to claim 1,
wherein a metallic material for each of the first metal electrode and the second metal electrode is at least any one of chromium, nickel, titanium and molybdenum.

10. The secondary battery according to claim 1,
wherein a metallic material for each of the first metal electrode and the second metal electrode is an alloy containing at least any one of chromium, nickel, titanium and molybdenum.

11. The secondary battery according to claim 1,
wherein a metallic material for each of the first metal electrode and the second metal electrode is an alloy containing at least copper and any one of chromium, nickel, titanium and molybdenum.

12. The secondary battery according to claim 3,
wherein a metallic material of at least one of the conductive metal layers is copper.

13. The secondary battery according to claim 1,
wherein a flexible insulating sheet is used as a substrate.

* * * * *